Figure 1:
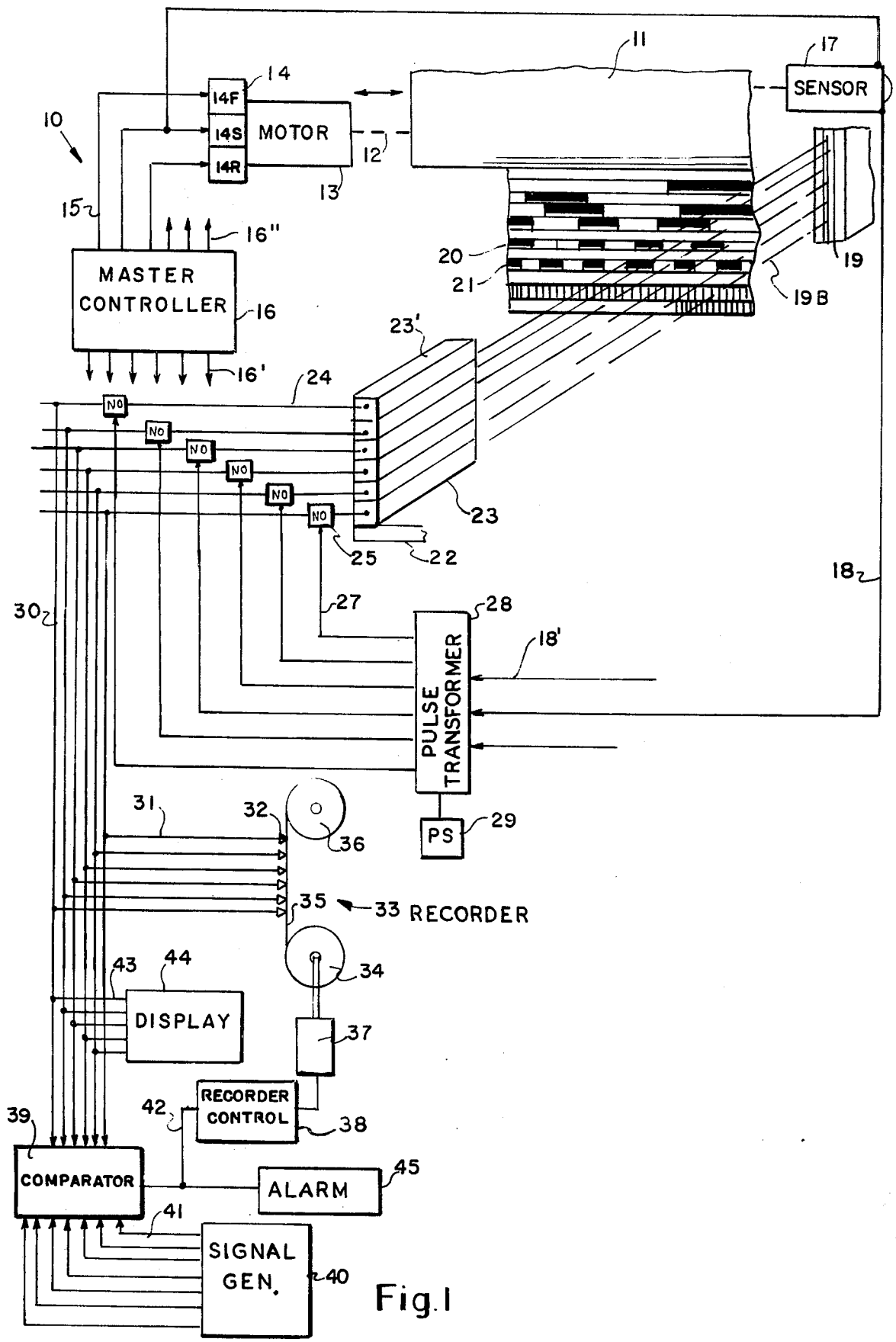

United States Patent [19]

Lemelson

[11] 4,047,025

[45] Sept. 6, 1977

[54] POSITION INDICATING SYSTEM AND METHODS

[76] Inventor: Jerome H. Lemelson, 85 Rector St., Metuchen, N.J. 08840

[21] Appl. No.: 470,823

[22] Filed: May 17, 1974

Related U.S. Application Data

[63] Continuation-in-part of Ser. No. 220,347, Jan. 24, 1972, abandoned, which is a continuation-in-part of Ser. No. 864,510, Oct. 7, 1969, Pat. No. 3,636,635, Ser. No. 518,616, Jan. 4, 1966, Pat. No. 3,476,481, Ser. No. 294,076, July 10, 1963, Pat. No. 3,481,042, Ser. No. 250,942, Jan. 11, 1963, Pat. No. 3,266,833, and Ser. No. 477,467, Dec. 24, 1954, abandoned.

[51] Int. Cl.² .............................................. H01J 3/14
[52] U.S. Cl. ................................. 250/237 G; 318/569; 340/347 P
[58] Field of Search ............... 250/566, 568, 570, 569, 250/555, 237 G, 231 SE; 318/569; 356/167, 170, 169; 33/174 L; 340/347 P

[56] References Cited

U.S. PATENT DOCUMENTS

| | | | |
|---|---|---|---|
| 3,078,404 | 2/1963 | Dumaire | 250/231 SE |
| 3,164,909 | 1/1965 | Rosenberg | 33/174 L |
| 3,226,833 | 1/1966 | Lemelson | 356/167 X |
| 3,261,968 | 7/1966 | Gale | 340/347 P |
| 3,284,618 | 11/1966 | Gotz | 318/569 |
| 3,307,172 | 2/1967 | Kolb | 346/1 X |
| 3,358,202 | 12/1967 | Pabst et al. | 250/231 X |
| 3,387,139 | 6/1968 | Gerard et al. | 250/237 G |
| 3,476,481 | 11/1969 | Lemelson | 356/167 |
| 3,481,042 | 12/1969 | Lemelson | 33/174 L |
| 3,562,536 | 2/1971 | Brunner | 250/566 |
| 3,573,471 | 4/1971 | Kolb | 250/568 |
| 3,636,635 | 1/1972 | Lemelson | 33/174 L |

*Primary Examiner*—David C. Nelms

[57] ABSTRACT

An apparatus and method are provided for indicating the location of a device such as a machine tool component or an inspection probe so as to permit the automatic control thereof or the derivation of information defining its position for automatically measuring the dimensions of a work piece. The apparatus includes a scale containing digital information recorded along its length and a photo-optical scanning means for the scale operable to generate a parallel code on its output, such as a binary code, which is indicative of the relative location of the scanning means and the scale.

In one form, the scale is connected to a machine tool component and a photoelectric scanning means is held stationary while the component moves relative thereto wherein the output of the scanning means is indicative of the relative position between the component and the scanning means or the degree of movement of the component from a home location. In another form, the scanning means moves with the machine component and scans the digital scale which is fixed relative thereto. The output of the scanning means may be gated to a receiver connected to a recorder, a digital display or a comparator for receiving signals when a sensor in the component senses the surface of the work so as to indicate if the surface is or is not located at a desired location.

11 Claims, 2 Drawing Figures

POSITION INDICATING SYSTEM AND METHODS

RELATED APPLICATIONS

This is a continuation-in-part of application Ser. No. 220,347 filed Jan. 24, 1972, now abandoned, which was a continuation-in-part of Ser. No. 864,510 filed Oct. 7, 1969, for Automatic Measurement Apparatus, now U.S. Pat. No. 3,636,635, a continuation-in-part of Ser. No. 518,616 filed Jan. 4, 1966, now U.S. Pat. No. 3,476,481, a continuation-in-part of Ser. No. 250,942 filed Jan. 11, 1963, now U.S. Pat. No. 3,266,833 and Ser. No. 294,076 filed July 10, 1963, now U.S. Pat. No. 3,481,042, and a continuation-in-part of application Ser. No. 477,467 filed Dec. 24, 1954, now abandoned.

SUMMARY OF THE INVENTION

This invention relates to an apparatus and method for automatically indicating the location of a machine tool component or measuring head relative to a base by photo-optically scanning length-indicating recordings on a machine tool member such as a binary digital code scale secured to a machine component and movable therewith.

Various apparatus and methods have been employed to indicate the movement of one machine tool component with respect to another for automatic control purposes. Limit switches generating pulses with each revolution or fraction of a revolution of a motor or drive shaft have been employed to indicate the degrees of movement of machine tool components. U.S. Pat. No. 2,628,539 provides a method of indicating machine tool displacements by scanning a series of recordings to generate pulse trains as one machine component moves with respect to another and automatic counting means is employed to count the number of pulses so generated as an indication of the degree or distance of travel thereof. Such systems suffer certain shortcomings in that, if a single or a plurality of pulses are lost or fail to be counted, errors are introduced into the system which will generate a false summation. Furthermore, the counting device may be defective or may not indicate the degree of movement until a total count is made of the pulses received thereby.

The instant invention is concerned with a position indicating system applicable for controlling machines of various types, which system will provide a parallel code on its output at any time a signal is generated to control the output thereof, thereby permitting use of the system in a variety of applications in which the pulse train generating technique would not be applicable. The apparatus provided herein also permits the instant sampling of information generated in scanning a digital scale to permit the attainment of codes which are indicative of the location of a machine tool component or probe at any particular instant, thereby permitting the system to be used in a surface mapping mode.

Accordingly it is a primary object of this invention to provide a new and improved apparatus and method for automatically indicating position of a machine component relative to a fixed location or base.

Another object is to provide an electro-optical scanning system which is applicable to a variety of machine tool components to indicate the degree of their movement on their location upon sensing the surface of a work piece.

Another object is to provide an automatic position indicating system which is relatively simple in structure and foolproof in operation.

Another object is to provide an automatic inspection probe and an indicator of its location such that it may be used to measure dimensions of locations of a work piece.

With the above and such other objects in view as may hereinafter more fully appear, the invention consists of the novel constructions, combinations and arrangements of parts as will be more fully described and illustrated in the accompanying drawings, but it is to be understood that changes, variations and modifications may be resorted to which fall within the scope of the invention as claimed.

Figure 2:
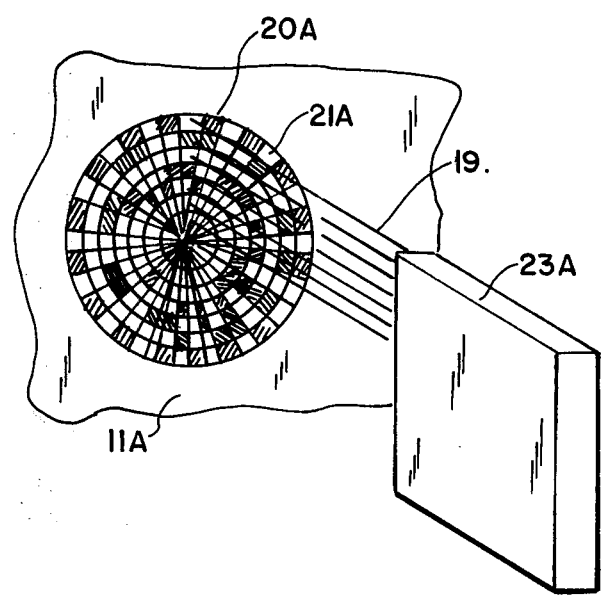

FIG. 1 is a schematic diagram illustrating control components defining the invention and FIG. 2 illustrates a scanning arrangement applicable to a modified form of the invention.

In FIG. 1 is shown components of an automatic control and position indicating apparatus 10 for digitally indicating or generating electrical signals which are indicative of the position of one machine tool component with respect to that of another 22 or the base of the machine tool. Automatic indication is effected by providing an opticaly readable scale 20 on one of the components denoted 11. The component 11 may comprise a probe or manipulator arm forming part of the machine tool or may comprise a tool positioning arm or frame such as that which directly or indirectly holds the machine tool head or spindle. The scale 20 is in the form of a bar or plate 20' of transparent or translucent material such as glass or plastic and contains a code scale 21 composed of a plurality of strips 21' which are divided into opaque bars 21b disposed between transparent or light transmittng spaces 21c. The bars and spaces are so arranged that they form respective binary digital codes along each unitary lateral portion of the scale.

To effect the generation of each binary digital code, a bank 23 of electro-optical scanning transducers 23' such as photomultipliers is provided supported on a mount 22 to position the transducers in direct alignment with the scale 20 so that each transducer scans a particular strip area thereof and all transducers may simultaneously scan a lateral unit code location of the scale. To facilitate scanning, a light source 19 is operable to generate a thin-sheet-like beam of light denoted 19B and transmit same through the scale to the inputs of the photo-optical scanning devices 23'. Thus the binary code present on the outputs 24 of the bank of photo-optical reading devices 23' at any particular instant is a code indication of the location of the scale 24 and the machine tool component 11 with respect to the support or mount 22 on which the photo-optical scanners are mounted. Said mount 22 may comprise, for example, a bed of a machine tool which contains a guideway or other means for guideably supporting the machine tool component or arm 11 in a fixed path adjacent thereto or it may comprise any other machine tool component with respect to which the component 11 is guided or otherwise moved in lineal and or rotary motion such that the scale 20 will be intercepted by the sheet-like light beam 19B, the light of which will be passed to the bank of photo-optical reading devices 23' for generating binary digital codes on the outputs 24 thereof to provide an indication of the location or degree of movement of the machine component 11.

Notation 16 refers to a master controller such as a multicircuit timer, tape reader, computer or other device which is operable to generate control signals on a plurality of outputs thereof for controlling the motors which operate the machine tool to move one or more components of the tool with respect to work for inspecting said work as set forth, for example in application Ser. No. 864,510 or for controlling operation of the machine in performing preprogrammed operations on the work.

A first group of outputs 15 of master controller 16 extend to controls 14 for a reversable motor 13, the output shaft of which is connected to drive the machine component or probe arm 11 in a first direction such that a sensor 17 supported by said arm or a tool head associated therewith may sense the surface of a work piece to generate a control signal on its output 18 which is transmitted to a pulse transformer 28. The outputs 27 of the pulse transformer 28 gate respective signals to momentarily close a plurality of normally open switches 25 in the outputs 24 of the photo-optical scanning devices 23. Thus when the sensor 17 is energized upon detecting the surface of a work piece, the particular binary digital code present on the outputs 24 when said sensor is energized, may be passed through the closed normally open switches 25 to respective outputs 25' thereof which are connected to circuits 30 extending to a recorder 33, a display 44, and a comparitor device 39.

If the switches 25 are momentarily closed by the pulses received from the outputs 27 of pulse transformer 28, the parallel code signal passed therethrough from the photoelectric cells of the bank 22 is an indication of the location of the surface of the work sensed by sensor 17 which code may be immediately recorded by transmitting same to parallel circuits 31 which extend to a bank 32 of recording heads forming part of the recorder 33 which records said parallel binary code across the length of a recording tape 35 such as magnetic tape as the tape is driven from a supply reel 36 to a takeup reel 34 by means of a drive motor 37. A recording is thus effected of the location of the surface of the work sensed by sensor 17 which may be retained for future reference or reproduction if it is desired to calculate the distance between the surface measured and that of another surface of the work sensed by the sensor 17.

A second group of outputs 16' extends from the master controller 16 for controlling other motors associated with the inspection or manipulating apparatus of which the arm machine component 11 defines one part. Said other motors may be controlled by open-loop control means employing signals generated by master controller 16 directly thereto or by means of respective closed loop control systems employing the medium of feedback to effect control, for example, of the movement of the machine component 11 or probe arm in additional directions as taught, for example in application Ser. No. 864,510. A plurality of further outputs 16" of the master controller 16 are connected to additional machine or inspection probe operating elements such as tool motor controls for automatically controlling same by means of the signals generated by controller 16 in accordance with the control of motor 13. Control 14F, for example, receives a signal from master controller 16 and is operable to start motor 13 to drive machine component 11 towards the work until the signal generated by sensor 17 is passed to control 14S which stops motor 13 or a secondocontrol signal is generated by master controller 16 which is passed to the stop control 14S. Thereafter a further signal is generated on another output of master controller 16 and transmitted to the reverse control 14R of motor 13 causing arm or component 11 to be driven away from the work while additional signals are generated on the outputs 16' and 16" for controlling the movement of arm 11 in a plurality of other directions, if necessary.

Extensions 43 of parallel code circuits 30 are connected to a visual display unit 44 which may contain display tubes or other devices for digitally or otherwise indicating to the operator thelocation of the surface sensor by sensor 17 as a result of the code generated on outputs 24 when said surface is sensed.

Conparator device 39 may comprise a code matching relay of the type shown in U.S. Pat. No. 3,081,379 for comparing a standard code, generated on a plurality of lines 41 from manual bi-stable switches or a code generator 40, with the code generated on circuits 30 when the sensor 17 senses the surface of a work piece. Thus if the code present on circuits 41 is matched by the code present on circuits 30, the output 39' of comparator 39 will be energized and may be passed to energize an alarm or indicator 45 or to prevent the operation of such alarm. The output 39' is also shown connected to a circuit 42 extending to a controller 38 for controlling the operation of the motor 37 driving the takeup reel 34 of the recorder so that recording may be properly effected by the bank of recording heads 32 of said recorder.

Comparator 39 may also be operable to generate a signal on its output 39' in a manner set forth in U.S. Pat. No. 3,081,379 only when there is a variance between the code generated on circuits 30 and 41 indicating that the location of the surface sensed by sensor 17 is out of tolerance.

The apparatus illustrated in the drawing and described above may be modified, for example, to measure distance between surfaces by passing the codes generated on output circuits 25' to various logical circuits such as adding or subtracting circuits for generating binary code signals which are indicative of the distance between surfaces sensed by sensor 17 and indicated by the codes transmitted thereto from the bank 22 of photo-optical reading devices 23 upon sensing each surface.

In yet another mode of operation, the reading arrangement illustrated in the drawing may be utilized to control the movement of the machine component 11 by pulsing another input 18' to the pulse transformer 28 at different times during a control cycle to pass the parallel binary code signals generated on circuits 24 to the outputs 25' which may extend to a control computer containing logical circuits for controlling the apparatus by comparing the codes transmitted thereto with location codes recorded in the computer and effecting control when said location codes and the received codes match or are equal by generating control signals upon such matching for stopping, starting or otherwise controlling one or more motors operating the apparatus.

It is obvious that the scanning system illustrated in the drawing may be applied to a plurality of interconnected machine tool or inspection probe components for either indicating the location of the component or inspection probe along two or more axes wherein at least one bank of photoelectric cells or photo-optical reading devices such as 23' and a respective scale is provided for controlling or indicating probe movement along each axis.

The signals generated on the outputs 24 of the bank of photo-optical reading devices 23' when the normally open switches 25 are closed may also be passed directly to a digital computer of which the recorder 33 may form a part. The digital computer may be programmed and operable to utilize said binary digital signals to effect further control of the apparatus 10 such as control of the further movement of machine component 11 or the operation of tooling associated with the apparatus 10 for predeterminately or adaptively controlling operations on the work located adjacent the machine component 11.

In another form of the invention, the scale 20 may be made of a light reflecting or light emitting material having opaque or light absorbing areas disposed along the code tracks as illustrated to define the parallel code. The scale 20 may also be formed on the machine component 11 or a projecting or attached panel portion thereof by projecting an image of said scale onto said component or panel portion thereof. The photoelectric cells 23' or bank 23 may be of a sensitivity to permit them to generate output signals indicative of the code defined by the portion of the projected image which is in alignment with the cells at the instant reading or grating is effected as described. If the scale or projected image thereof is disposed on an extended area of the component 11 which is greater than the length of the strip area read by the bank of scanners 23' then the code generated on the outputs 24 at any instant will be an indication not only of the relative location of the component in a direction parallel to the code tracks but also in a direction normal thereto. Such an arrangement may be utilized to digitize a surface against which one or more arrays of code track tracks of the type shown in the drawing or modified forms thereof are projected with light. If the surface of the component or member onto which the scale is projected is irregular, the code or grid lines so projected will become distorted and the manner in which they are distorted will be an indication of the surface shape or configuration of the surface onto which they are projected. Electron beam, laser or photoelectric cell scanning of the surface containing the distorted images will result in a variable output signal consisting of discrete pulses the durations and time spacings of which will be a function of the surface shape or configuration if the characteristics of the undistorted projected code tracks or uninterrupted grid lines are known. In other words, by projecting images of equispaced, equal with grid lines on a surface using, for example, light of sufficient intensity passed through a filmstrip containing an image of said grid lines and thereafter scanning said image formed of said lines or grid with an electron beam such as that generated by a flying spot scanner, television tube, deflection controlled laser beam or one or more photoelectric cells arranged and transported as described, an electrical signal may be derived, composed of a chain or pulses of variable duration, which when analyzed by suitable logic circuitry, may be digitized to indicate the shape characteristics of the surface scanned. The signals generated by such scanning may thus be utilized to map and indicate the shape of the surface so scanned for inspection-measurement purposes. Signal analyzing techniques as taught in my pending application Ser. No. 267,377 may be employed to map or compare the signals with standard signals and indicate variations from standard.

In another form of the instant invention, the machine component 11 may be pivotally or rotationally supported on the machine tool base and the scale 20 may comprise a circular array of optically scannable digital code tracks of the type shown in FIG. 2, which tracks are concentric with each other and are rotatable about the axis of rotation between the machine component and the base. In such an arrangement, the bank of photoelectric cells 21A extends radially of the axis of rotation with each cell thereof being operable to scan a different concentric track 21A of the scale 20A as the component rotates on or with the machine element.

As also illustrated in FIG. 2, the circular scale 20A of concentric optically scannable tracks 21A may be mounted fixed to the base 11A of the machine or a component thereof with its center disposed along the axis of rotation of the machine component on the base. The housing 23A contains the bank of photoelectric cells and, in certain instances, a source of light which is directed against the scale 20A for reading or sensing the indicia defining the marks or bars of the scale provided on the concentric tracks thereof by reflection of light from said source back to the photoelectric cells scanning said scale. Thus indications of the degree of relative rotation of the machine component on the machine base or other component with which relative rotation is effected are had by transmitting energizing pulses to the pulse transformer of FIG. 1, such as on line 18' which pulses may be generated by a clock, automatic controller, computer or other means such as a limit switch to periodically gate the outputs of the photoelectric cells to the described display or recorder or by generating pulses per se when the photoelectric cells each scan across a bright or dark area of their respective track of the scale.

In yet another form of the invention, the described photoelectric cells may be replaced by a bank of magnetic reproduction transducers and the parallel or concentric scale tracks of code indicating indicia may be replaced by parallel or concentric magnetic recording tracks each recorded with respective code pulse signals corresponding to the bar or spot codes illustrated in the scales 20 and 20A of FIGS. 1 and 2. In other words, the scale 20 of FIG. 1 or 20A of FIG. 2 may comprise sheets or strips of magnetic recording material such as plastic film containing suitable ferrite or chromium dioxide magnetic recording material coated thereon instead of the visual or optically scannable marks or indicia described above. The magnetic reproduction transducers replacing the described photoelectric cells may be spring biased and urged against the parallel or concentric code bearing magnetic tracks so as to reproduce signals therefrom during relative rotation of the component containing the magnetic transducers and the component containing the magnetic record member or said transducers may be supported on a mount which is advanced by motor, solenoid or other means into engagement with the magnetic record member or scale when it is desired to initiate angular movement indication or indicate the angular relative position between the two machine components. In such a latter function, e.g., that of indicating relative angular position at any instant, the magnetic reproduction transducers may be of the flux sensitive type which will generate on their outputs signals indicative of the recordings on the magnetic record scale even if relative movement between the machine components has stopped. Thus if the magnetic record track contains a binary code scale in parallel array across the parallel or concentric magnetic tracks, instantaneous indication of the relative position of the machine components on which the transducers and record tracks are mounted may be had by sensing the outputs of the reproduction transducers at any instant. The sensing operation to determine the relative position of the components in electrical code form may be effected by pulsing input 18' to pulse transformer 28 of FIG. 1 to close the normally open switches 25 at the desired instant and permits the signals existing on the outputs of the magnetic transducers to pass to the display, computer or recorder.

I claim:

1. An apparatus for measuring an indicating machine component position comprising:

a base, a machine component movably supported by said base, means for guiding and controllably driving said machine component on said base in a predetermined path to effect relative controlled movement of said component and said base with respect to each other, a digital code scale fixedly supported by said machine component and movable therewith so as to permit said code scale to move with respect to said base when said component is driven on said base, scanning means supported adjacent said machine component and operatively located to scan said digital code scale as the machine component and scale and said base relatively move with respect to each other, said scanning means being operable to generate digital information as code signals as said scanning means said digital code scale, which code signals are indicative of the degree of relative movement of said component with respect to said base, and transducing means operatively connected to receive said code signals generated by said scanning means and operable to effect a transducing operation with respect to the signals generated by said scanning means, and means connected to said transducing means for receiving and utilizing the information generated by said transducing means.

2. An apparatus in accordance with claim 1 wherein said digital code scale contains discrete parallel digital code recordings provided along the length of said scale and wherein each of said digital code recordings is indicative of a predetermined increment in distance along the code scale over the previous recording, and said scanning means is operable to selectively scan each of said digital code recordings as the component moves with respect to said base and operatively generates digital code signals which are indicative of the degree of relative movement between said machine component and said base.

3. An apparatus in accordance with claim 2 wherein said scale is composed of separate parallel tracks of information and said scanning means includes a bank of photoelectric cells each of which photoelectric cells is operable to simultaneously scan a separate track of said scale and generate discrete code signals in sequence, each of which code signals is indicative of the degree of relative movement between said component and said base.

4. An apparatus in accordance with claim 1 wherein said transducing means is operable to record said digital information on a record member.

5. An apparatus in accordance with claim 4 including control means in the form of a gating means for gating digital code signals therethrough to said transducing means, and signal generating means associated with said apparatus, said signal generating means being connected to said said gating means and operable to generate signals for activating said gating means in accordance with relative movement of said machine component with said base.

6. An apparatus in accordance with claim 5 wherein said signal generating means comprises a work sensing means operable to generate a signal for closing said gating means upon sensing the surface of a unit of work disposed in alignment with said machine component.

7. An apparatus in accordance with claim 5 wherein said signal generating means is a sensor supported at one end of said machine component and said machine component is controlled to move in a fixed direction towards work disposed adjacent said base.

8. An apparatus in accordance with claim 7 wherein said sensing means is operable to generate a signal upon contact with a surface of said work disposed adjacent said machine component.

9. An apparatus in accordance with claim 1 wherein said scanning means comprises a bank of photoelectric cells and said digital scale comprises a plurality of photo-optically scannable record tracks extending parallel to each other and each located on said scale to be scanned by a respective photoelectric cell of said bank of cells, said digital scale being constructed such that the simultaneous outputs of said photoelectric cells will generate a digital code indication of the degree of relative movement of said base and said machine component with respect to each other.

10. An apparatus in accordance with claim 9 wherein the tracks of said digital code scale extend in concentric circular paths and wherein each of said photoelectric cells scans a respective circular track of said digital scale.

11. An apparatus in accordance with claim 1 wherein said scanning means comprises a bank of magnetic reproduction transducers and said digital scale comprises a plurality of magnetic recording tracks extending parallel to each other, said transducers being of the flux sensitive type and operable to generate signals on their outputs when sensing magnetic recordings on said tracks even if relative movement between the machine components has terminated.

* * * * *